US012791630B2

(12) United States Patent
Ji et al.

(10) Patent No.: US 12,791,630 B2
(45) Date of Patent: Nov. 10, 2026

(54) POWER TRANSMISSION LINE PHOTONICS-ELECTRONICS CONVERGED LONG-DISTANCE MONITORING DEVICE AND METHOD

(71) Applicant: CHINA ELECTRIC POWER RESEARCH INSTITUTE, Beijing (CN)

(72) Inventors: Kunpeng Ji, Beijing (CN); Bin Liu, Beijing (CN); Yongfeng Cheng, Beijing (CN); Junke Han, Beijing (CN); Jialun Yang, Beijing (CN); Ruiming Tong, Beijing (CN); Bin Zhao, Beijing (CN); Jingshan Han, Beijing (CN); Danyu Li, Beijing (CN); Peng Li, Beijing (CN); Lichun Zhang, Beijing (CN); Jian Wang, Beijing (CN); Xueping Zhan, Beijing (CN); Mengxuan Li, Beijing (CN)

(73) Assignee: CHINA ELECTRIC POWER RESEARCH INSTITUTE, Beijing (CN)

( * ) Notice: Subject to any disclaimer, the term of this patent is extended or adjusted under 35 U.S.C. 154(b) by 332 days.

(21) Appl. No.: 18/713,722

(22) PCT Filed: Jan. 24, 2022

(86) PCT No.: PCT/CN2022/073585

§ 371 (c)(1),
(2) Date: Jul. 17, 2024

(87) PCT Pub. No.: WO2023/092853

PCT Pub. Date: Jun. 1, 2023

(65) Prior Publication Data

US 2025/0028009 A1 Jan. 23, 2025

(30) Foreign Application Priority Data

Nov. 26, 2021 (CN) ......................... 202111417923.3

(51) Int. Cl.
*G02B 6/00* (2006.01)
*G01D 5/353* (2006.01)
*G01R 31/58* (2020.01)

(52) U.S. Cl.
CPC ......... *G01R 31/58* (2020.01); *G01D 5/35316* (2013.01)

(58) Field of Classification Search
CPC .... G01R 31/58; G01D 5/35316; G01D 5/353; G02B 6/00
See application file for complete search history.

(56) References Cited

U.S. PATENT DOCUMENTS 11,568,766 B2 * 1/2023 Ziock .................... G09F 3/0376
12,379,234 B2 * 8/2025 Lauwers ........... G01D 5/35312
(Continued)

FOREIGN PATENT DOCUMENTS

CN 101483567 A 7/2009
CN 201628558 U 11/2010
(Continued)

OTHER PUBLICATIONS

International Search Report in the international application No. PCT/CN2022/073585, mailed on Aug. 29, 2022, 2 pages.
(Continued)

*Primary Examiner* — Jennifer Doan
(74) *Attorney, Agent, or Firm* — Cooper Legal Group, LLC

(57) ABSTRACT

A power transmission line photonics-electronics converged long-distance monitoring device (10) and method. The device (10) comprises: a fiber grating demodulation module (101), used for transmitting a laser signal to a fiber grating
(Continued)

sensor, receiving a first optical signal returned by the fiber grating sensor, demodulating the first optical signal, and outputting the demodulated first optical signal to an edge computing and signal return module (104); a convergence module (102), used for receiving sensing data of monitoring devices other than the fiber grating sensor on a power transmission line and converging the sensing data, and outputting the converged sensing data to an electro-optical conversion module (103); the electro-optical conversion module (103), used for receiving the converged sensing data and converting the converged sensing data into a second optical signal, and outputting the second optical signal to the edge computing and signal backhaul module (104); and the edge computing and signal return module (104), used for computing and encoding the demodulated first optical signal and the second optical signal, and returning the obtained encoded signals to a monitoring master station.

15 Claims, 5 Drawing Sheets

(56) References Cited

U.S. PATENT DOCUMENTS

| | | | | |
|---|---|---|---|---|
| 2013/0278918 | A1 | 10/2013 | Glavind et al. | |
| 2021/0223657 | A1 * | 7/2021 | Wang ........................ | G02B 6/00 |

FOREIGN PATENT DOCUMENTS

| | | | |
|---|---|---|---|
| CN | 103178902 | A | 6/2013 |
| CN | 205177152 | U | 4/2016 |
| CN | 105783756 | A | 7/2016 |
| CN | 217032539 | U | 7/2022 |
| GB | 2485808 | A | 5/2012 |

OTHER PUBLICATIONS

English translation of the Written Opinion of the International Search Authority in the international application No. PCT/CN2022/073585, mailed on Aug. 29, 2022, 6 pages.

* cited by examiner

POWER TRANSMISSION LINE PHOTONICS-ELECTRONICS CONVERGED LONG-DISTANCE MONITORING DEVICE AND METHOD

CROSS-REFERENCE TO RELATED APPLICATION

This application is based on and claims priority to Chinese patent application No. 202111417923.3 filed on Nov. 26, 2021 and entitled "POWER TRANSMISSION LINE PHOTONICS-ELECTRONICS CONVERGED LONG-DISTANCE MONITORING DEVICE AND METHOD", the content of which is hereby incorporated by reference in its entirety.

TECHNICAL FIELD

The disclosure relates to the field of optical fiber monitoring technology of a power transmission line, and in particular to a photoelectric fusion long-distance monitoring device and method for a power transmission line.

BACKGROUND

In the current technology of the electronic sensing of a transmission line, affected by power supply difficulties in field sites and signal transmission difficulties in areas without public networks, the monitoring device has problems concerning the reliability and confidentiality of signal transmission over long distances. In the current technology of optical fiber grating monitoring for the transmission line, an optical signal monitored (returned) by optical fiber grating sensors needs to be demodulated by an optical fiber grating demodulator at a monitoring master station, which may only monitor the signals of the optical fiber grating sensors on the line within a range of tens of kilometers. It is difficult to cover the entire length of the long-distance transmission line and the monitoring distance is limited. Furthermore, due to the bandwidth limitations of the light source of the demodulator, each optical fiber can only be connected to a few tens of optical fiber grating sensors, which is not conducive to implementing fine monitoring for multiple types of parameters across the entire power transmission line.

SUMMARY

Embodiments of the disclosure are expected to provide a photoelectric fusion long-distance monitoring device and method for a power transmission line.

In a first aspect, an embodiment of the disclosure provides a photoelectric fusion long-distance monitoring device for a power transmission line. The monitoring device is installed on a tower and includes: an optical fiber grating demodulation module, a convergence module, an electro-optical conversion module, and an edge calculation and signal return module.

The optical fiber grating demodulation module is connected to the edge calculation and signal return module and optical fiber grating sensors of different channels on the power transmission line. The optical fiber grating demodulation module is configured to transmit a laser signal to the optical fiber grating sensors, receive first optical signals returned from the optical fiber grating sensors, demodulate the first optical signals, and output the demodulated first optical signals to the edge calculation and signal return module.

The convergence module is connected to the electro-optical conversion module. The convergence module is configured to receive sensing data of other monitoring devices on the power transmission line other than the optical fiber grating sensors, converge the sensing data, and output the converged sensing data to the electro-optical conversion module.

The electro-optical conversion module is connected to the edge calculation and signal return module. The electro-optical conversion module is configured to receive the converged sensing data, convert the converged sensing data into a second optical signal, and output the second optical signal to the edge calculation and signal return module.

The edge calculation and signal return module is connected to a monitoring master station. The edge calculation and signal return module is configured to calculate, encode and process the demodulated first optical signals and the second optical signal to obtain an encoded communication optical signal, and return the encoded communication optical signal to the monitoring master station.

In a second aspect, an embodiment of the disclosure further provides a photoelectric fusion long-distance monitoring method for a power transmission line. The method includes the following operations.

An optical fiber grating demodulation module transmits a laser signal to an optical fiber grating sensor on the power transmission line, receives a first optical signal returned from the optical fiber grating sensor, demodulates the first optical signal, and outputs the demodulated first optical signal to an edge calculation and signal return module.

A convergence module receives sensing data of other monitoring devices on the power transmission line other than the optical fiber grating sensor, converges the sensing data, and outputs the converged sensing data to an electro-optical conversion module.

The electro-optical conversion module receives the converged sensing data, converts the converged sensing data into a second optical signal, and outputs the second optical signal to the edge calculation and signal return module.

The edge calculation and signal return module calculates, encodes and processes the demodulated first optical signal and the second optical signal to obtain an encoded communication optical signal, and returns the encoded communication optical signal to a monitoring master station.

In the embodiment of the disclosure, the optical fiber grating demodulation module transmits the laser signal to the optical fiber grating sensors, receives the first optical signals returned from the optical fiber grating sensors, demodulates the first optical signals, and outputs the demodulated first optical signals to the edge calculation and signal return module. The convergence module receives the sensing data of other monitoring devices on the power transmission line other than the optical fiber grating sensors, converges the sensing data, and outputs the converged sensing data to the electro-optical conversion module. The electro-optical conversion module receives the converged sensing data, converts the converged sensing data into the second optical signal, and outputs the second optical signal to the edge calculation and signal return module. The edge calculation and signal return module calculates, encodes and processes the demodulated first optical signals and the second optical signal to obtain the encoded signal, and returns the encoded communication optical signal to the monitoring master station. In this way, the first optical signals returned by the optical fiber grating sensors may be demodulated on the spot such that the demodulated first optical signals are obtained. The sensing data of other monitoring devices other than the optical fiber grating sensors is converged, and the converged sensing data is converted into the second optical signal. The demodulated first optical signals and the second optical signal are then uniformly encoded such that the encoded communication optical signal is obtained and returned to the monitoring master station. Compared to an optical reflection wavelength signal, the communication optical signal experiences minimal loss during transmission in the optical fiber, which effectively solves the problem of reliability and confidentiality of signal long-distance transmission for the monitoring device. Furthermore, the number of optical fiber grating sensors of different channels on the entire transmission line may be increased from tens to a massive number, which is conducive to implementing fine monitoring of various types of parameters across the entire power transmission line.

BRIEF DESCRIPTION OF THE DRAWINGS

The drawings here are incorporated into and form a part of the specification. The drawings illustrate embodiments conforming to the disclosure and are used in combination with the specification to illustrate the technical solutions of the disclosure.

DETAILED DESCRIPTION

Figure 1:
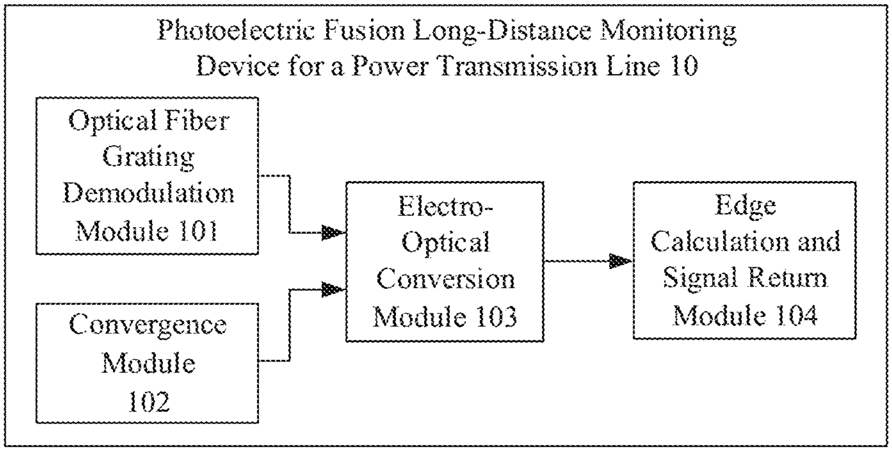
FIG. 1 is a schematic composition structure diagram of a photoelectric fusion long-distance monitoring device for a power transmission line provided by an embodiment of the disclosure.

Specific implementations of the disclosure are illustrated in further detail below in combination with the drawings and embodiments. It is to be understood that the embodiments provided herein are only used to explain the disclosure and are not used to limit the disclosure. In addition, the embodiments provided below are some of the embodiments used to implement the disclosure, rather than all of the embodiments for implementing the disclosure are provided. Technical solutions recorded in the embodiments of the disclosure may be implemented in a manner of any combination without conflict.

It is to be noted that in the embodiments of the disclosure, the terms "include", "contain", or any other variations thereof are intended to cover non-exclusive inclusion, such that a system including a series of elements includes not only the explicitly described elements but also other elements that are not explicitly listed, or further includes elements that are inherent for implementing the system. Without further limitation, elements limited by the expression "including a . . . " does not preclude the existence of additional relevant elements in the system that includes the element (e.g., a unit in the system, for example, the unit in the system may be a part of a circuit, or the like).

The term "and/or" herein is only a description of an association relationship of associated objects, representing that there may be three kinds of relationships. For example, "U and/or W" may represent three conditions, i.e., independent existence of U, existence of both U and W, and independent existence of W. In addition, the term "at least one" herein indicates any one of multiple ones, or any combination of at least two of the multiple ones. For example, "including at least one of U, W or V" may indicate that any one or more elements selected from a set consisting of U, W and V are included.

An optical fiber grating sensor, which takes an optical fiber grating as a sensitive element, has advantages of being passive and not affected by the electromagnetic interference. The monitoring signal is returned through an Optical Fiber Composite Overhead Ground Wire (OPGW), which has high communication reliability and safety, and overcomes deficiencies of the current electronic sensors. For ultra-high voltage and extra-high voltage transmission lines in areas without public network signals and areas with harsh field environments, it is particularly suitable to use the optical fiber grating sensing technology to perform condition monitoring. However, in the conventional optical fiber grating monitoring solution for the transmission line, on one hand, the demodulator has a bulky volume (the size is around 1U chassis), a high power consumption (the power is up to tens of watts), and a high cost (the price of a single unit is from more than 100,000 RMB to hundreds of thousands of RMB), and can only be installed in a transformer substation. Only an optical fiber grating demodulator is installed in the monitoring master station to demodulate the optical signals returned through the OPGW, so as to obtain the state parameters of the line. In the current optical fiber grating sensing solution for the transmission line, the reflection signal of the light is limited by objective factors such as the optical fiber transmission loss and connection loss during the transmission, and in the actual engineering application, due to the light source intensity and demodulation capabilities of the demodulator, the demodulator installed in the transformer substation may only monitor signals of optical fiber grating sensors on the line within a range of tens of kilometers. It is difficult to cover the entire length of the long-distance transmission line and the monitoring distance is limited. On the other hand, due to the resource constraints of the OPGW fiber cores, generally, only one or two optical fibers may be allocated to the demodulator for line condition monitoring. Limited by the bandwidth of the light source of the demodulator, one optical fiber can only be connected to tens of optical fiber grating sensors, which is far from meeting the requirements for monitoring many parameters of the transmission line.

In addition, with the digital construction of the power grid company, key sections of the transmission line are also installed with a certain number of monitoring devices based on other theories, such as a camera, a tension sensor based on a strain gauge, a vibration sensor based on the piezoelectric effect or Micro-Electro-Mechanical System (MEMS) process, or the like. However, for the aforementioned types of sensors and monitoring devices installed on a power transmission line that passes through an environment with a harsh field climate, on one hand, power supply reliability for long-term operation is difficult to be guaranteed, and is vulnerable to strong electromagnetic interference. On the other hand, currently, monitoring signals of such sensors are returned to the monitoring master station mainly through the public network mobile signals or wireless network hopping. For a line section that is located in areas without public network signals or a line section that is hundreds of kilometers away from the monitoring master station, the monitoring signal is difficult to be returned, the transmission rate is limited, and the confidentiality is difficult to be guaranteed.

Based on the aforementioned technical problems, an embodiment of the disclosure provides a photoelectric fusion long-distance monitoring device for a power transmission line (which may also be referred to as a photoelectric fusion terminal). As shown in FIG. 1, the monitoring device 10 is installed on a tower. The monitoring device 10 includes an optical fiber grating demodulation module 101, a convergence module 102, an electro-optical conversion module 103, and an edge calculation and signal return module 104.

The optical fiber grating demodulation module 101 is connected to the edge calculation and signal return module 104 and optical fiber grating sensors of different channels on the power transmission line. The optical fiber grating demodulation module 101 is configured to transmit a laser signal to the optical fiber grating sensors, receive first optical signals returned from the optical fiber grating sensors, demodulate the first optical signals, and output the demodulated first optical signals to the edge calculation and signal return module 104.

The convergence module 102 is connected to the electro-optical conversion module 103. The convergence module 102 is configured to receive sensing data of other monitoring devices on the power transmission line other than the optical fiber grating sensors, converge the sensing data, and output the converged sensing data to the electro-optical conversion module 103.

The electro-optical conversion module 103 is connected to the edge calculation and signal return module 104. The electro-optical conversion module 103 is configured to receive the converged sensing data, convert the converged sensing data into a second optical signal, and output the second optical signal to the edge calculation and signal return module 104.

The edge calculation and signal return module 104 is connected to a monitoring master station. The edge calculation and signal return module 104 is configured to calculate, encode and process the demodulated first optical signals and the second optical signal to obtain an encoded communication optical signal, and return the encoded communication optical signal to the monitoring master station. In some implementations, the other monitoring devices include at least one of a camera, a micro-meteorological monitoring device, a tension sensor, a wireless vibration sensor or a wireless temperature measurement sensor.

In the embodiment of the disclosure, the optical fiber grating demodulation module transmits the laser signal to the optical fiber grating sensors, receives the first optical signals returned from the optical fiber grating sensors, demodulates the first optical signals, and outputs the demodulated first optical signals to the edge calculation and signal return module. The convergence module receives the sensing data of other monitoring devices on the power transmission line other than the optical fiber grating sensors, converges the sensing data, and outputs the converged sensing data to the electro-optical conversion module. The electro-optical conversion module receives the converged sensing data, converts the converged sensing data into the second optical signal, and outputs the second optical signal to the edge calculation and signal return module. The edge calculation and signal return module calculates, encodes and processes the demodulated first optical signals and the second optical signal to obtain the encoded communication optical signal, and returns the encoded communication optical signal to the monitoring master station. In this way, the first optical signals returned by the optical fiber grating sensors may be demodulated on the spot such that the demodulated first optical signals are obtained. The sensing data of other monitoring devices other than the optical fiber grating sensors is converged, and the converged sensing data is converted into the second optical signal. The demodulated first optical signals and the second optical signal are then uniformly encoded and returned to the monitoring master station. Compared to an optical reflection wavelength signal, the communication optical signal experiences minimal loss during transmission in the optical fiber, which effectively solves the problem of reliability and confidentiality of signal long-distance transmission for the monitoring device. Furthermore, the number of optical fiber grating sensors of different channels on the entire transmission line may be increased from tens to a massive number, which is conducive to implementing fine monitoring of various types of parameters across the entire power transmission line.

Figure 2:
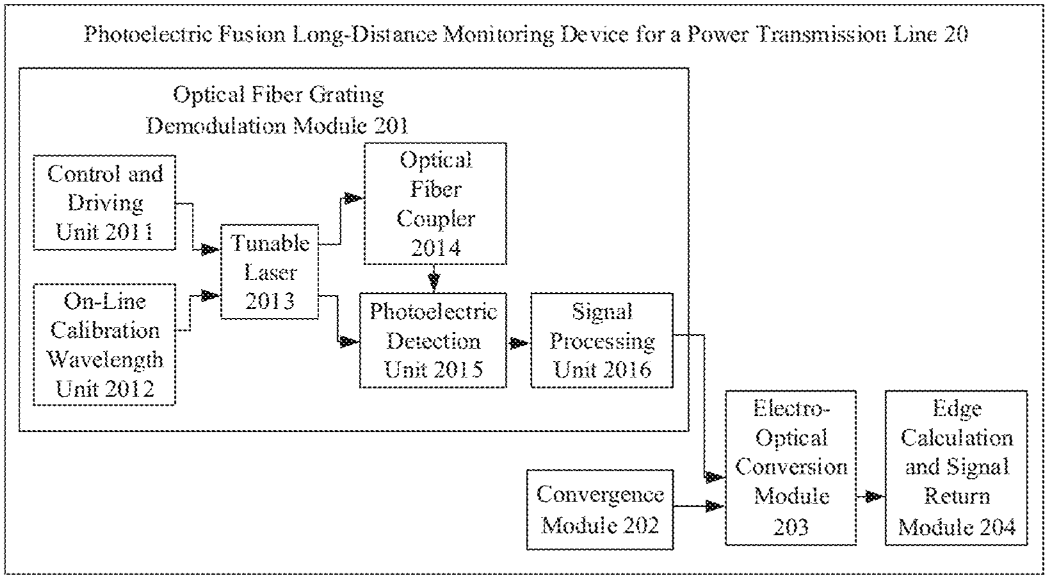
FIG. 2 is another schematic composition structure diagram of a photoelectric fusion long-distance monitoring device for a power transmission line provided by an embodiment of the disclosure.

FIG. 2 is another schematic composition structure diagram of a photoelectric fusion long-distance monitoring device for a power transmission line provided by an embodiment of the disclosure. As shown in FIG. 2, the photoelectric fusion long-distance monitoring device 20 for the power transmission line is installed on a tower. The device includes an optical fiber grating demodulation module 201, a convergence module 202, an electro-optical conversion module 203, and an edge calculation and signal return module 204. The optical fiber grating demodulation module 201 includes a control and driving unit 2011, an on-line calibration wavelength unit 2012, a tunable laser 2013, an optical fiber coupler 2014, a photoelectric detection unit 2015 and a signal processing unit 2016.

The control and driving unit 2011 is connected to the tunable laser 2013. The control and driving unit 2011 is configured to generate a control signal to control and drive the tunable laser 2013 through the control signal.

The on-line calibration wavelength unit 2012 is connected to the tunable laser 2013. The on-line calibration wavelength unit 2012 is configured to generate a calibration signal to calibrate a laser signal output by the tunable laser 2013.

The tunable laser 2013 is connected to the optical fiber coupler 2014 and the photoelectric detection unit 2015. The tunable laser 2013 is configured to transmit the laser signal to the optical fiber coupler 2014 based on the control signal and the calibration signal.

The optical fiber coupler 2014 is connected to the optical fiber grating sensors and the photoelectric detection unit 2015. The optical fiber coupler 2014 is configured to shunt the laser signal, transmit the shunted laser signals to the optical fiber grating sensors of the different channels on the power transmission line, receive the first optical signals returned from the optical fiber grating sensors, combine the first optical signals, and transmit the combined first optical signals to the photoelectric detection unit 2015.

The photoelectric detection unit 2015 is connected to the signal processing unit 2016. The photoelectric detection unit 2015 is configured to convert the combined first optical signals into an electrical signal, and transmit the electrical signal to the signal processing unit 2016.

The signal processing unit 2016 is connected to the edge calculation and signal return module 204. The signal processing unit 2016 is configured to demodulate the electrical signal to obtain the demodulated first optical signals, and output the demodulated first optical signals to the edge calculation and signal return module 204.

The convergence module 202 is connected to the electro-optical conversion module 203. The convergence module 202 is configured to receive the sensing data of the other monitoring devices on the power transmission line other than the optical fiber grating sensors, converge the sensing data, and output the converged sensing data to the electro-optical conversion module 203.

The electro-optical conversion module 203 is connected to the edge calculation and signal return module 204. The electro-optical conversion module 203 is configured to receive the converged sensing data, convert the converged sensing data into the second optical signal, and output the second optical signal to the edge calculation and signal return module 204.

The edge calculation and signal return module 204 is connected to the monitoring master station. The edge calculation and signal return module 204 is configured to calculate, encode and process the demodulated first optical signals and the second optical signal to obtain the encoded communication optical signal, and return the encoded communication optical signal to the monitoring master station through an OPGW.

In some implementations, the type of the optical fiber coupler 2014 is determined through the total number of the optical fiber grating sensors.

In the embodiment of the disclosure, the tunable laser transmits the laser signal to the optical fiber coupler based on the control signal generated by the control and driving unit and the calibration signal generated by the on-line calibration wavelength unit. The optical fiber coupler shunts the transmitted laser signal, transmits the shunted laser signals to the optical fiber grating sensors, receives the first optical signals returned from the optical fiber grating sensors, and transmits the combined first optical signals to the photoelectric detection unit. The combined first optical signals are converted into the electrical signal by the photoelectric detection unit, and the electrical signal is demodulated by the signal processing unit, such that the demodulated first optical signals are obtained. In this way, demodulation and processing may be performed on the spot on the monitoring signals of the optical fiber grating sensors by the monitoring device.

Figure 3:
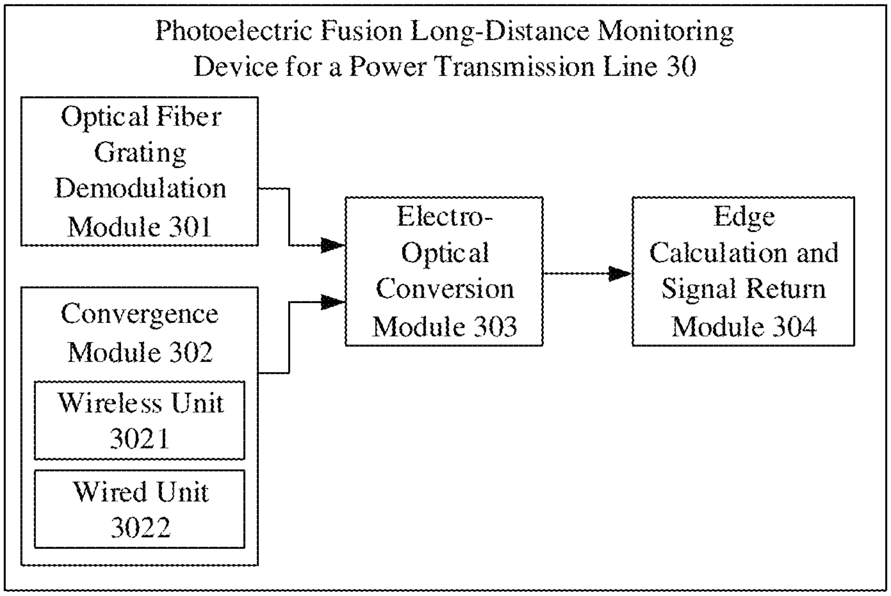
FIG. 3 is yet another schematic composition structure diagram of a photoelectric fusion long-distance monitoring device for a power transmission line provided by an embodiment of the disclosure.

FIG. 3 is yet another schematic composition structure diagram of a photoelectric fusion long-distance monitoring device for a power transmission line provided by an embodiment of the disclosure. As shown in FIG. 3, the monitoring device 30 includes an optical fiber grating demodulation module 301, a convergence module 302, an electro-optical conversion module 303, and an edge calculation and signal return module 304. The convergence module 302 includes a wireless unit 3021 and a wired unit 3022.

The optical fiber grating demodulation module 301 is connected to the edge calculation and signal return module 304 and the optical fiber grating sensors of different channels on the power transmission line. The optical fiber grating demodulation module 301 is configured to transmit the laser signal to the optical fiber grating sensors, receive the first optical signals returned from the optical fiber grating sensors, demodulate the first optical signals, and output the demodulated first optical signals to the edge calculation and signal return module 304.

The convergence module 302 is connected to the electro-optical conversion module 302. The wireless unit 3021 is configured to receive first sensing data, converge the first sensing data, and output the converged first sensing data to the electro-optical conversion module 303. The first sensing data corresponds to a first device, which adopts wireless transmission, among the other monitoring devices other than the optical fiber grating sensors. The second sensing data corresponds to a second device, which adopts wired transmission, among the other monitoring devices other than the optical fiber grating sensors.

The wired unit 3022 is configured to receive second sensing data, converge the second sensing data, and output the converged second sensing data to the electro-optical conversion module 303.

The electro-optical conversion module 303 is connected to the edge calculation and signal return module 304. The electro-optical conversion module 303 is configured to receive the converged sensing data, convert the converged sensing data into the second optical signal, and output the second optical signal to the edge calculation and signal return module 304.

The edge calculation and signal return module 304 is connected to the monitoring master station. The edge calculation and signal return module 304 is configured to calculate, encode and process the demodulated first optical signals and the second optical signal to obtain the encoded communication optical signal, and return the encoded communication optical signal to the monitoring master station through the OPGW.

In some implementations, the wireless unit 3021 receives the first sensing data by at least one of LoRa, Bluetooth, ZigBee or Wi-Fi.

In some implementations, the wired unit 3022 receives the second sensing data via at least one of an RS485 bus or an optical fiber.

In the embodiment of the disclosure, the first sensing data, which corresponds to the first device among the other monitoring devices that adopts the radio transmission, may be received by the wireless unit. The second sensing data, which corresponds to the second device among the other monitoring devices that adopts the wired transmission, may be received by the wired unit. In this way, not only monitoring data of the optical fiber grating sensors may be obtained, but also the sensing data of the first device among the other monitoring devices that adopts the radio transmission and the second device among the other monitoring devices that adopts the wired transmission may be obtained, and the monitoring is more comprehensive.

Figure 4:
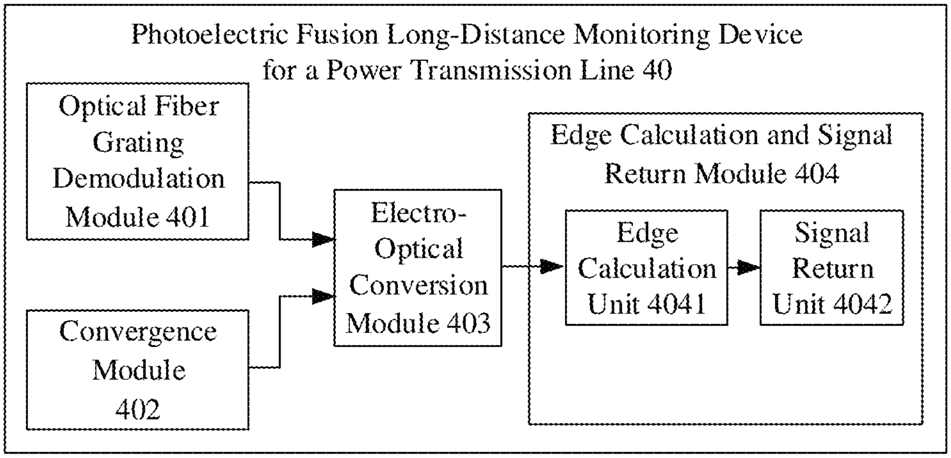
FIG. 4 is still another schematic composition structure diagram of a photoelectric fusion long-distance monitoring device for a power transmission line provided by an embodiment of the disclosure.

FIG. 4 is still another schematic composition structure diagram of a photoelectric fusion long-distance monitoring device for a power transmission line provided by an embodiment of the disclosure. As shown in FIG. 4, the monitoring device 40 includes an optical fiber grating demodulation module 401, a convergence module 402, an electro-optical conversion module 403, and an edge calculation and signal return module 404. The edge calculation and signal return module 404 includes an edge calculation unit 4041 and a signal return unit 4042.

The optical fiber grating demodulation module 401 is connected to the edge calculation and signal return module 404 and the optical fiber grating sensors of different channels on the power transmission line. The optical fiber grating demodulation module 401 is configured to transmit the laser signal to the optical fiber grating sensors, receive the first optical signals returned from the optical fiber grating sensors, demodulate the first optical signals, and output the demodulated first optical signals to the edge calculation and signal return module 404.

The convergence module 402 is connected to the electro-optical conversion module 403. The convergence module 402 is configured to receive the sensing data of the other monitoring devices on the power transmission line other than the optical fiber grating sensors, converge the sensing data, and output the converged sensing data to the electro-optical conversion module 403.

The electro-optical conversion module 403 is connected to the edge calculation unit 4041. The electro-optical conversion module 403 is configured to receive the converged sensing data, convert the converged sensing data into the second optical signal, and output the second optical signal to the edge calculation and signal return module 404.

The edge calculation unit 4041 is connected to the optical fiber grating demodulation module 401 and the signal return unit 4042. The edge calculation unit 4041 is configured to perform fault or abnormality information extraction on the demodulated first optical signals and the second optical signal through an edge calculation algorithm to obtain extracted information, encode the extracted information to obtain the encoded communication optical signal, and transmit the encoded communication optical signal to the signal return unit 4042.

The signal return unit 4042 is connected to the monitoring master station. The signal return unit 4042 is configured to receive the encoded communication optical signal and return the encoded communication optical signal to the monitoring master station.

In the embodiment of the disclosure, the edge calculation unit performs the fault or abnormality information extraction on the demodulated first optical signals and the second optical signal through the edge calculation algorithm to obtain the extracted information, encodes the extracted information to obtain the encoded communication optical signal, and returns the encoded communication optical signal to the monitoring master station through the signal return unit. In this way, unified encoding and unified return may be implemented.

Figure 5:
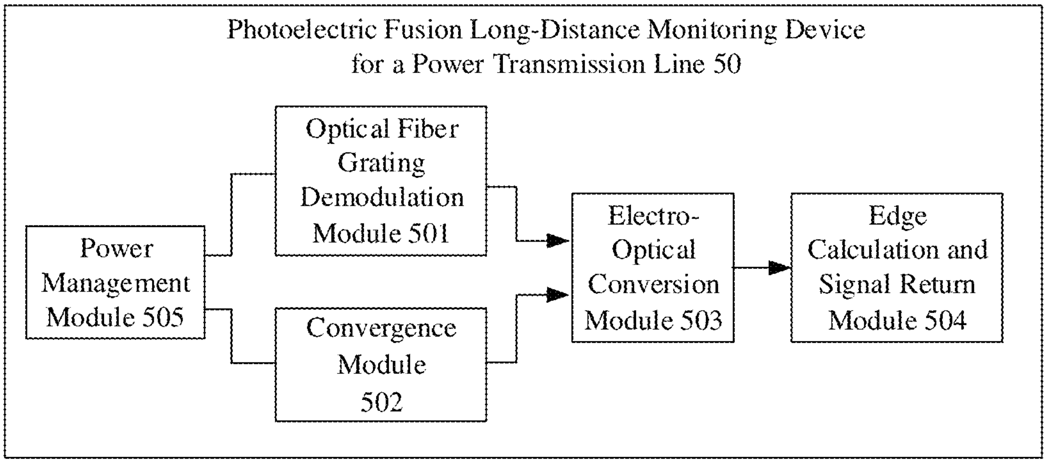
FIG. 5 is still another schematic composition structure diagram of a photoelectric fusion long-distance monitoring device for a power transmission line provided by an embodiment of the disclosure.

FIG. 5 is still another schematic composition structure diagram of a photoelectric fusion long-distance monitoring device for a power transmission line provided by an embodiment of the disclosure. As shown in FIG. 5, the detection device includes an optical fiber grating demodulation module 501, a convergence module 502, an electro-optical conversion module 503, an edge calculation and signal return module 504, and a power management module 505.

The optical fiber grating demodulation module 501 is connected to the edge calculation and signal return module 504 and the optical fiber grating sensors of different channels on the power transmission line. The optical fiber grating demodulation module 501 is configured to transmit the laser signal to the optical fiber grating sensor, receive the first optical signal returned from the optical fiber grating sensor, demodulate the first optical signal, and output the demodulated first optical signal to the edge calculation and signal return module 504.

The convergence module 502 is connected to the electro-optical conversion module 503. The convergence module 502 is configured to receive the sensing data of the other monitoring devices on the power transmission line other than the optical fiber grating sensors, converge the sensing data, and output the converged sensing data to the electro-optical conversion module 503.

The electro-optical conversion module 503 is connected to the edge calculation and signal return module 504. The electro-optical conversion module 503 is configured to receive the converged sensing data, convert the converged sensing data into the second optical signal, and output the second optical signal to the edge calculation and signal return module 504.

The edge calculation and signal return module 504 is connected to the monitoring master station. The edge calculation and signal return module 504 is configured to calculate, encode and process the demodulated first optical signal and the second optical signal to obtain the encoded communication optical signal, and return the encoded communication optical signal to the monitoring master station.

The power management module 505 is connected to the optical fiber grating demodulation module 501 and the convergence module 502. The power management module 505 is configured to perform power supply management on the optical fiber grating demodulation module 501 and the convergence module 502 in the monitoring device.

A power supply form of the power management module 505 comprises at least one of a storage battery, photovoltaic, wind energy or induction power extraction.

In the embodiment of the disclosure, the power supply management is performed on the device by the power management module 505 that is based on multiple power supply forms, which ensures the power supply reliability of the device for long-term operation.

The embodiments of the disclosure, on one hand, solve the problem of the previous optical fiber grating monitoring schemes where the number of sensors that can be connected in series is small and the monitoring distance is short, and on the other hand, solve the problems of signal transmission difficulties and poor security for traditional monitoring devices installed in areas without public networks.

Figure 6:
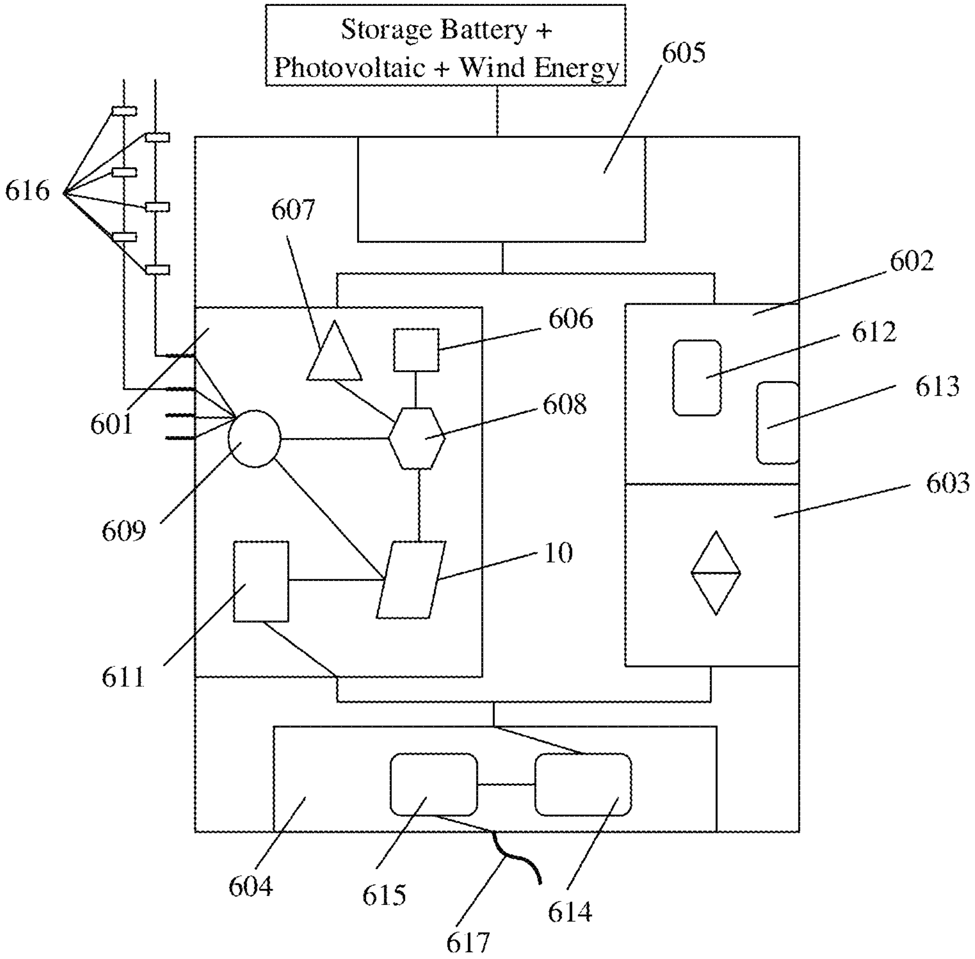
FIG. 6 is still another schematic composition structure diagram of a photoelectric fusion long-distance monitoring device for a power transmission line provided by an embodiment of the disclosure.

FIG. 6 is still another schematic composition structure diagram of a photoelectric fusion long-distance monitoring device for a power transmission line provided by an embodiment of the disclosure. As shown in FIG. 6, the monitoring device includes an optical fiber grating demodulation module 601, a convergence module 602, an electro-optical conversion module 603, an edge calculation and signal return module 604, and a power management module 605.

In the embodiment of the disclosure, the optical fiber grating demodulation module 601 is responsible for performing demodulation and processing on the spot on an optical fiber grating sensor 616 on the power transmission line. The optical fiber grating demodulation module 601 includes a control and driving unit 606, an on-line calibration wavelength unit 607, a tunable laser 608, an optical fiber coupler 609, a photoelectric detection unit 610 and a signal processing unit 611.

The control and driving unit 606 is connected to the tunable laser 608. The control and driving unit 606 is configured to control and drive the tunable laser 608.

The on-line calibration wavelength unit 607 is connected to the tunable laser 608. The on-line calibration wavelength unit 607 is configured to calibrate a laser wavelength output by the tunable laser 608, which ensures that the optical fiber grating demodulation module 601 does not need to be calibrated again after leaving the factory, and that a high-precision measurement may be ensured for a long time.

The tunable laser 608 is connected to the optical fiber coupler 609 and the photoelectric detection unit 610. The tunable laser 608 is configured to output a broad-spectrum laser to the optical fiber coupler 609 under the control and driving of the control and driving unit 606.

The optical fiber coupler 609 is connected to optical fiber grating sensors 616 of different channels and the photoelectric detection unit 610. The optical fiber coupler 609 is configured to shunt the laser output by the tunable laser 608, transmit the shunted lasers correspondingly to the optical fiber grating sensors 616 on different channels, and receive optical signals reflected by the optical fiber grating sensors 616 on different channels. Furthermore, the optical fiber coupler 609 is configured to combine the optical signals reflected by the optical fiber grating sensors 616 on different channels, and transmit the combined reflected optical signal to the photoelectric detection unit 610.

The photoelectric detection unit 610 is connected to the signal processing unit 611. The photoelectric detection unit 610 is configured to convert the combined reflected optical signal transmitted by the optical fiber coupler 609 into an electrical signal, and transmit the electrical signal to the signal processing unit 611.

The signal processing unit 611 is connected to the edge calculation and signal return module 604. The signal processing unit 611 is configured to process the electrical signal transmitted by the photoelectric detection unit 610, and output the processed electrical signal to the edge calculation and signal return module 604.

The wavelength width of the light source of the tunable laser 608 may be determined according to the maximum number of optical fiber grating sensors 616 connected to a single channel. The type of the optical fiber coupler 609 may be selected according to the total number of optical fiber grating sensors 616 to be connected. The corresponding number of channels may be set to 1, 2, 4, 8, or other numbers.

In an embodiment of the disclosure, the convergence module 602 includes a wireless unit 612 and a wired unit 613.

The wireless unit 612 (e.g., LoRa, Bluetooth, ZigBee, Wi-Fi, etc.) is configured to converge sensing data of other monitoring devices adopting wireless transmission on the power transmission line, and output the converged sensing data of the other monitoring devices adopting the wireless transmission to the electro-optical conversion module 603.

The wired unit 613 (e.g. an RS485 bus, an optical fiber, etc.) is configured to converge sensing data of other monitoring devices adopting wired transmission on the power transmission line, and output the converged sensing data of the other monitoring devices adopting the wired transmission to the electro-optical conversion module 603.

The monitoring devices based on other theories on the power transmission line include a camera, a micro-meteorological monitoring device, a tension sensor, a wireless vibration sensor and a wireless temperature measurement sensor.

In the embodiment of the disclosure, the electro-optical conversion module 603 is mainly responsible for converting sensing signals, which are sensed by monitoring devices based on other principles and inputted by the convergence module 602, into optical signals, and output the optical signals to the edge calculation and signal return module 604. The optical signals are then returned to the host computer of the monitoring master station through a connection optical fiber 617 (hereinafter may be the OPGW), which solves the problem of reliability and confidentiality of the signal long-distance transmission of the conventional monitoring device.

In the embodiment of the disclosure, after collecting data inputted by the optical fiber grating demodulation module 601 and the electro-optical conversion module 603, the edge calculation and signal return module 604 extracts fault or abnormality information by processing the data with the edge calculation algorithm. The edge calculation and signal return module 604 encodes the extracted fault or abnormality to obtain the encoded communication optical signal, and returns the encoded communication optical signal to the host computer of the monitoring master station through the OPGW, so as to solve the problem that the monitoring range of the optical fiber grating is restricted. The edge calculation and signal return module 604 includes an edge calculation unit 614 and a signal return unit 615.

The edge calculation unit 614 is connected to the optical fiber grating demodulation module 601, the electro-optical conversion module 603 and the signal return unit 615. The edge calculation unit 614 is configured to perform, through the edge calculation algorithm, the fault or abnormality information extraction on the electrical signal transmitted by the optical fiber grating demodulation module 601 and the optical signal transmitted by the electro-optical conversion module 603, encode the extracted fault or abnormality information to obtain the encoded communication optical signal, and transmit the encoded communication optical signal to the signal return unit 615.

The signal return unit 615 is connected to the monitoring master station through the connection optical fiber 617. The signal return unit 615 is configured to receive the encoded communication optical signal and return the encoded communication optical signal (in the form of an encoded signal) to the monitoring master station through the connection optical fiber 617.

It is to be noted that for a photoelectric fusion terminal with a small amount of converged monitoring data, the edge calculation unit 614 may be removed to reduce the power consumption. For a photoelectric fusion terminal with an installation location far away from the monitoring master station, a signal amplifier may be added to the signal return unit 615 to ensure the signal-to-noise ratio of the signal during the long-distance transmission.

In an embodiment of the disclosure, the power management module 605 is responsible for managing the power supply of the photoelectric fusion terminal. The power form includes one of or a combination of a storage battery, a solar panel, wind energy, or induction power extraction.

It is to be understood that the photoelectric fusion terminal is an abbreviation for a photoelectric fusion long-distance monitoring device for a power transmission line.

In addition, the embodiments of the disclosure provide a solution in which there are multiple optical fiber grating sensors 616 and monitoring devices based on other theories on the line at the same time. In a practice application, the convergence module 602 and the electro-optical converter module 603 may be optionally installed according to the installation condition of the existing monitoring devices on the line. For an in-service line section or a newly constructed line without installation of any monitoring device, a photoelectric comprehensive monitoring solution for a power transmission line with the best overall benefit may be proposed by comprehensively considering the technical characteristics and cost differences of the conventional monitoring device, and the optical fiber grating sensor 616 and the photoelectric fusion terminal.

Figure 7:
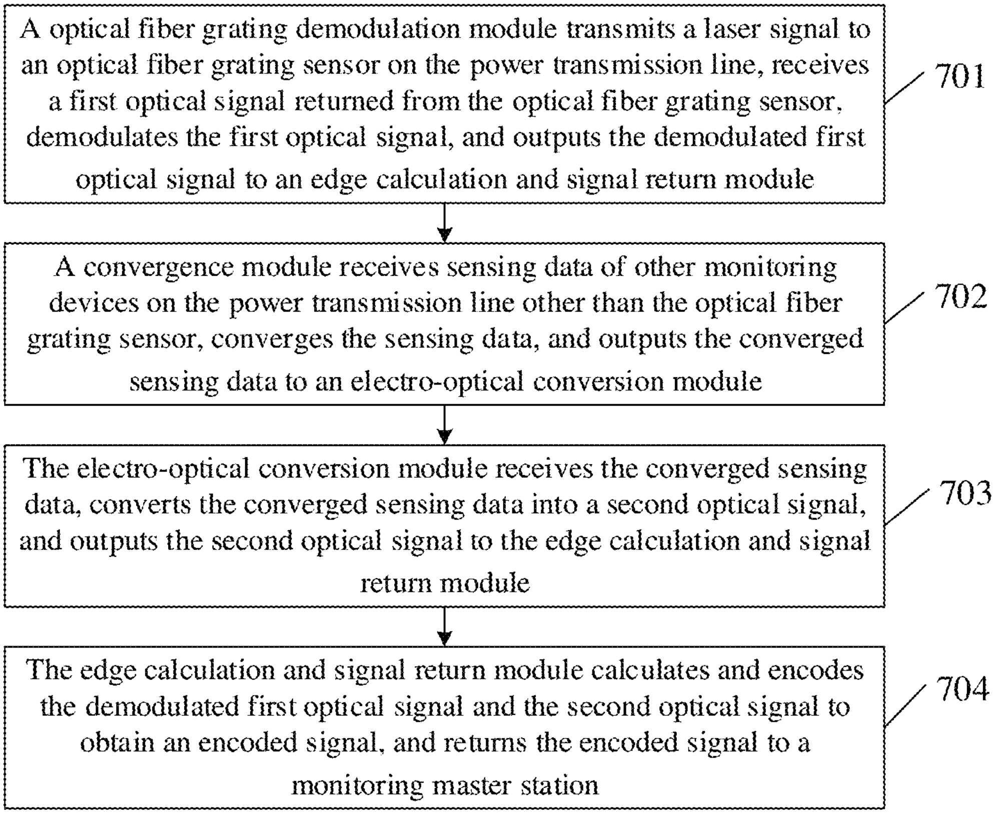
FIG. 7 is a schematic implementation flowchart of a photoelectric fusion long-distance monitoring method for a power transmission line provided by an embodiment of the disclosure.

On the basis of the aforementioned embodiments, an embodiment of the disclosure provides a photoelectric fusion long-distance monitoring method for a power transmission line. As shown in FIG. 7, the flow of the method includes the following operations.

In operation 701, an optical fiber grating demodulation module transmits a laser signal to an optical fiber grating sensor on the power transmission line, receives a first optical signal returned from the optical fiber grating sensor, demodulates the first optical signal, and outputs the demodulated first optical signal to an edge calculation and signal return module.

In operation 702, a convergence module receives sensing data of other monitoring devices on the power transmission line other than the optical fiber grating sensor, converges the sensing data, and outputs the converged sensing data to an electro-optical conversion module.

In operation 703, the electro-optical conversion module receives the converged sensing data, converts the converged sensing data into a second optical signal, and outputs the second optical signal to the edge calculation and signal return module.

In operation 704, the edge calculation and signal return module calculates, encodes and processes the demodulated first optical signal and the second optical signal to obtain an encoded communication optical signal, and returns the encoded communication optical signal to a monitoring master station.

An embodiment of the application further provides a photoelectric fusion long-distance monitoring method for a power transmission line. The flow of the method includes the following operations.

In operation S801, a control and driving unit generates a control signal to control and drive a tunable laser through the control signal.

In operation S802, an on-line calibration wavelength unit generates a calibration signal to calibrate a laser wavelength outputted by the tunable laser.

In operation S803, the tunable laser transmits a laser signal to an optical fiber coupler based on the control signal and the calibration signal.

In operation S804, the optical fiber coupler shunts the laser signal, transmits the shunted laser signals to optical fiber grating sensors of different channels on the power transmission line, receives first optical signals returned from the optical fiber grating sensors, combines the first optical signals, and transmits the combined first optical signals to a photoelectric detection unit.

In operation S805, the photoelectric detection unit converts the combined first optical signals into an electrical signal, and transmits the electrical signal to a signal processing unit.

In operation S806, the signal processing unit demodulates the electrical signal to obtain the demodulated first optical signals, and outputs the demodulated first optical signals to the edge calculation and signal return module.

In operation S807, a wireless unit receives first sensing data, converges the first sensing data, and outputs the converged first sensing data to the electro-optical conversion module.

In operation S808, a wired unit receives second sensing data, converges the second sensing data, and outputs the converged second sensing data to the electro-optical conversion module.

In operation S809, the electro-optical conversion module receives the converged sensing data, converts the converged sensing data into the second optical signal, and outputs the second optical signal to the edge calculation and signal return module.

In operation S810, an edge calculation unit performs fault or abnormality information extraction on the demodulated first optical signal and the second optical signal through an edge calculation algorithm to obtain extracted information, encodes the extracted information to obtain the encoded communication optical signal, and transmits the encoded communication optical signal to a signal return unit.

In operation S811, the signal return unit receives the encoded communication optical signal, and returns the encoded communication optical signal to the monitoring master station.

In operation S812, the monitoring master station identifies, processes and displays the encoded communication optical signal returned by a monitoring device.

An embodiment of the application further provides a photoelectric fusion long-distance monitoring method for a power transmission line. The flow of the method includes the following operations.

In operation S901, the optical fiber grating demodulation module transmits the laser signal to the optical fiber grating sensor on the power transmission line, receives the first optical signal returned from the optical fiber grating sensor, demodulates the first optical signal, and outputs the demodulated first optical signal to the edge calculation and signal return module.

In operation S902, the convergence module receives the sensing data of the other monitoring devices on the power transmission line other than the optical fiber grating sensor, converges the sensing data, and outputs the converged sensing data to the electro-optical conversion module.

In operation S903, a power management module performs power supply management on the optical fiber grating demodulation module and the convergence module in the monitoring device.

In operation S904, the electro-optical conversion module receives the converged sensing data, converts the converged sensing data into the second optical signal, and outputs the second optical signal to the edge calculation and signal return module.

In operation S905, the edge calculation and signal return module calculates, encodes and processes the demodulated first optical signal and the second optical signal to obtain the encoded communication optical signal, and returns the encoded communication optical signal to the monitoring master station.

The photoelectric fusion long-distance monitoring method for the power transmission line mainly implements the long-distance monitoring by means of a host computer, an OPGW, a photoelectric fusion terminal, the optical fiber grating sensor and various types of monitoring devices based on other theories. The host computer is installed in the monitoring master station (within the transformer substation). The photoelectric fusion terminal is installed on a tower and is connected in series to the OPGW. The optical fiber grating sensor and the various types of monitoring devices based on other theories converge data into the photoelectric fusion terminal in wired or wireless manner. In an application, multiple photoelectric fusion terminals may be installed on a power transmission line as required, and each photoelectric fusion terminal is responsible for converging, converting and returning signals of monitoring devices around its location. Each photoelectric fusion terminal is connected to an OPGW fiber core in series, and each fusion terminal is allocated with an independent code, which is convenient for the host computer of the monitoring master station to identify, process and display the returned signals.

In the embodiments of the disclosure, photoelectric fusion terminals may be installed on any number of towers, and tens to hundreds of optical fiber grating sensors may be connected to each terminal. In principle, massive optical fiber grating sensors may be connected to the entire line. Each photoelectric fusion terminal performs demodulation and processing on the spot on monitoring signals of optical fiber grating sensors installed on the transmission towers, the metal fittings, and the ground wire, converges data of monitoring devices based on other theories, and converts the data into the optical signal. The optical signal is then uniformly encoded and returned to the host computer in the monitoring master station (the transformer substation), and the transmission distance may be thousands of kilometers. Therefore, the disclosure not only solves the problem of the conventional optical fiber grating monitoring schemes where the number of sensors is small and the monitoring distance is short, but also effectively solves the problem of reliability and confidentiality of the signal long-distance transmission of the conventional monitoring device.

Regarding the optical fiber grating demodulation module in the photoelectric fusion terminal provided by the embodiments of the disclosure, the size is reduced by more than 90% (which is in the size of a cigarette box), the power is reduced by more than 70% (the power is within a few watts), and the cost is reduced by more than 70% (the price of a single optical fiber grating demodulation module is less than 30,000 RMB). The photoelectric fusion terminal provided by the disclosure may be installed on a tower along the line, and a single terminal may reserve multiple channels and may be connected to tens or hundreds of optical fiber grating sensors. In addition, in principle, an optical fiber may be connected to countless photoelectric fusion terminals in series. Therefore, with the solution provided by the disclosure, the number of optical fiber grating sensors that may be installed on a power transmission line is increased from tens to a massive number, which is conducive to implementing the fine monitoring of various types of parameters of the entire power transmission line.

In the solution provided by the embodiments of the disclosure, a single photoelectric fusion terminal only demodulates signals of optical fiber grating sensors within hundreds of meters, and converts the optical sensing signals into communication optical signals, which are then returned to the transformer substation through the optical fiber. Compared to an optical reflection wavelength signal, when the communication optical signal is transmitted in the optical fiber, the loss is very small, so that the communication optical signal may be transmitted stably over several hundred or even thousands of kilometers. Therefore, the solution provided by the disclosure improves the monitoring range of the optical fiber grating in the state of the power transmission line from tens of kilometers to hundreds or thousands of kilometers, which implements a qualitative leap in the monitoring range.

The photoelectric fusion long-distance monitoring device provided by the embodiments of the disclosure may demodulate and process the signals of the optical fiber grating sensors on the spot, and the signals are encoded and then returned to the monitoring master station in the form of communication optical signals, which improves the monitoring distance of the optical fiber grating sensing solution from tens of kilometers to thousands of kilometers. Furthermore, the power management module based on multiple power supply modes is further designed to manage the power supply of the device, which ensures the power supply reliability of the device for long-term operation.

An embodiment of the disclosure introduces a specific implementation process of a photoelectric fusion long-distance monitoring device and method for a power transmission line.

An ultra-high voltage line, which passes through an uninhabited area and an area without public network signals, and has a total length of more than 1,000 kilometers, is taken as an example. Multiple key sections along the route need to be monitored for condition parameters of the body structure of the transmission line (conductor tension, wire clip temperature, dancing, fault ranging, member bar stress, insulator wind deflection angle, overhanging string gravity, tower inclination angle, etc.) and environmental parameters of the transmission channel (wind speed and direction, ambient temperature and humidity, solar irradiation, precipitation, tower foundation settlement, video monitoring of tree barrier and mountain fire, etc.). Monitoring of the tower inclination angle, the member bar stress, the wind speed and direction, the ambient temperature and humidity, the solar irradiation, and the tower foundation settlement uses the optical fiber grating sensors. The monitoring device for the wire clip temperature, the dancing, the fault ranging, the insulator wind deflection angle, and the overhanging string gravity uses sensors based on other theories.

Figure 8A:
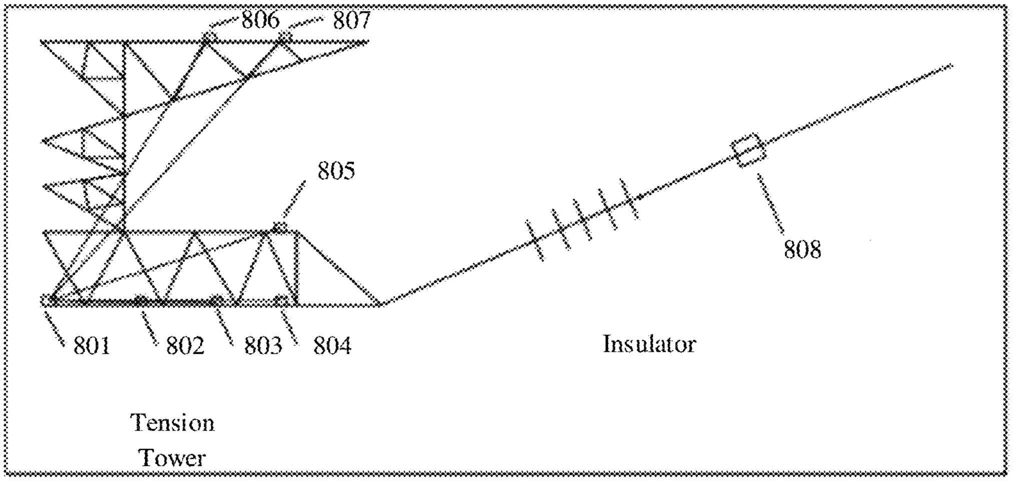
FIG. 8A is a schematic top view of an installation location of a single tower of a long-distance monitoring device for a power transmission line based on a photoelectric fusion terminal provided by an embodiment of the disclosure.
Figure 8B:
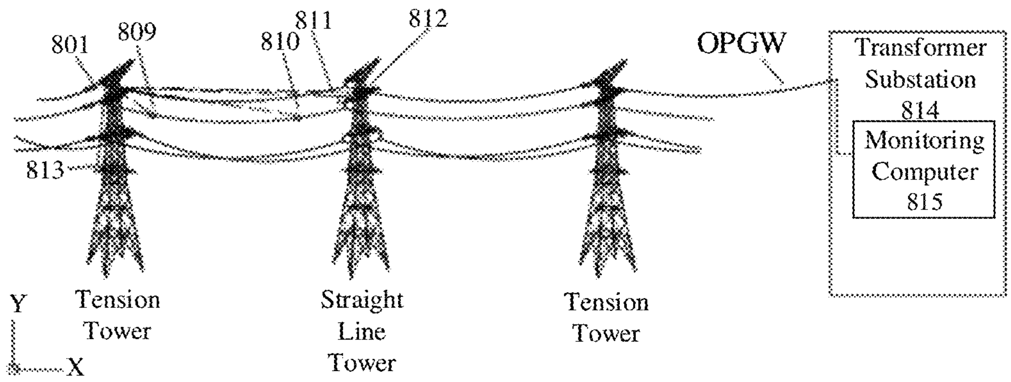
FIG. 8B is a schematic diagram of an overall installation location of a long-distance monitoring device for a power transmission line based on a photoelectric fusion terminal provided by an embodiment of the disclosure.

FIG. 8A is a schematic top view of an installation location of a single tower of a long-distance monitoring device for a power transmission line based on a photoelectric fusion terminal provided by an embodiment of the disclosure. FIG. 8B is a schematic diagram of an overall installation location of a long-distance monitoring device for a power transmission line based on a photoelectric fusion terminal provided by an embodiment of the disclosure.

As shown in FIG. 8B, a photoelectric fusion terminal B1 801 is installed on each to-be-monitored section of the entire line. Each photoelectric fusion terminal 801 covers a length of 500 meters to 4 kilometers, and each photoelectric fusion terminal B1 801 is connected to the OPGW in series.

Each photoelectric fusion terminal B1 801 is installed on a tension tower. In FIG. 8A, the optical fiber grating demodulation module of the photoelectric fusion terminal B1 801 is designed to have 2 channels. A tower inclination angle monitoring sensor B2 802 for tower inclination monitoring (which includes inclination angles in two directions and uses 4 optical fiber grating units) and a member bar stress monitoring sensor B3 803 for member bar stress monitoring (which monitors the main member, important diagonal members and cross arms, and uses 8 optical fiber grating units) are connected in series to the first channel of the optical fiber grating demodulation module through armored optical fibers. A wind speed and wind direction sensor B4 804 for wind speed and direction monitoring (which uses 4 optical fiber grating units), an ambient temperature and humidity sensor B5 805 for ambient temperature and humidity monitoring (which uses 2 optical fiber grating units), a solar irradiation sensor B6 806 for solar irradiation monitoring (which uses 1 optical fiber grating unit), and a tower foundation settlement sensor B7 807 for tower foundation settlement monitoring (which uses 4 optical fiber grating units) are connected in series to the second channel of the optical fiber grating demodulation module of the photoelectric fusion terminal B1 801 through armored optical fibers.

In FIG. 8B, a convergence module of the photoelectric fusion terminal B1 801 includes data interfaces and sensors of a wired unit (e.g., an RS485 bus, an optical fiber, etc.) and a wireless unit (e.g., LoRa, Bluetooth, ZigBee, Wi-Fi, etc.). A wire clip temperature sensor B8 808 transmits signals to the convergence module via Bluetooth. A dancing sensor B9 809 and a fault ranging sensor B10 810, which are installed between spans, and an insulator wind deflection angle sensor B11 811 and an overhanging string gravity sensor B12 812 on the straight line tower, transmit signals to the convergence module by means of LoRa, Wi-Fi, or the like. A video monitoring device B13 813 for tree barrier and mountain fire monitoring is installed on the tension tower, and is connected to the convergence module via an RS485 bus.

Optical fiber grating sensor signals collected by the two channels of the optical fiber grating demodulation module are processed by a photoelectric detection unit and a signal processing unit, and are then output to an edge calculation and signal return module. The convergence module outputs the collected various types of sensor signals based on other principles to an electro-optical conversion module. After the various types of sensor signals are converted into optical signals by the electro-optical conversion module, the optical signals are output to the edge calculation and signal return module.

Each photoelectric fusion terminal B1 801 is connected to the OPGW fiber core in series, and each photoelectric fusion terminal B1 801 is allocated with an independent code. The edge calculation and signal return module encodes the signals of the photoelectric fusion terminal B1 801 in which it is located, the encoded signals are returned through the OPGW to the host computer (monitoring computer) 815 of the monitoring master station (transformer substation) 814, and then the returned signals are identified, processed and displayed.

The aforementioned description of the various embodiments tends to emphasize the differences between the various embodiments, and their similarities may be referred to each other, which would not be repeated herein for the sake of brevity.

The features disclosed in various embodiments provided by the disclosure may be arbitrarily combined to obtain new product embodiments without conflict. Finally, it is to be noted that: the above embodiments are only used to illustrate the technical solution of the disclosure, and are not used to limit the scope of protection. Although the disclosure has been illustrated in detail with reference to the aforementioned embodiments, a person of ordinary skill in the art should understand that those skilled in the art may still make various changes, modifications or equivalent substitutions to the specific implementations of the disclosure after reading the disclosure, but these changes, modifications or equivalent substitutions are within the scope of protection of the claims.

The invention claimed is:

1. A photoelectric fusion long-distance monitoring device for a power transmission line, installed on a tower, comprising: an optical fiber grating demodulation circuit, a convergence circuit, an electro-optical converter, and an edge calculation and signal return circuit, wherein the optical fiber grating demodulation circuit is connected to the edge calculation and signal return circuit and optical fiber grating sensors of different channels on the power transmission line, and the optical fiber grating demodulation circuit is configured to transmit a laser signal to the optical fiber grating sensors, receive first optical signals returned from the optical fiber grating sensors, demodulate the first optical signals, and output the demodulated first optical signals to the edge calculation and signal return circuit;

the convergence circuit is connected to the electro-optical converter, and the convergence circuit is configured to receive sensing data of other monitoring devices on the power transmission line other than the optical fiber grating sensors, converge the sensing data, and output the converged sensing data to the electro-optical converter;

the electro-optical converter is connected to the edge calculation and signal return circuit, and the electro-optical converter is configured to receive the converged sensing data, convert the converged sensing data into a second optical signal, and output the second optical signal to the edge calculation and signal return circuit; and the edge calculation and signal return circuit is connected to a monitoring master station, and the edge calculation and signal return circuit is configured to calculate, encode and process the demodulated first optical signals and the second optical signal to obtain an encoded communication optical signal, and return the encoded communication optical signal to the monitoring master station.

2. The device of claim 1, wherein the optical fiber grating demodulation circuit comprises a control and driving circuit, an on-line calibration wavelength circuit, a tunable laser, an optical fiber coupler, a photoelectric detection circuit and a signal processing circuit;

wherein the control and driving circuit is connected to the tunable laser, and the control and driving circuit is configured to generate a control signal to control and drive the tunable laser through the control signal;

the on-line calibration wavelength circuit is connected to the tunable laser, and the on-line calibration wavelength circuit is configured to generate a calibration signal to calibrate a laser signal output by the tunable laser;

the tunable laser is connected to the optical fiber coupler and the photoelectric detection circuit, and the tunable laser is configured to transmit the laser signal to the optical fiber coupler based on the control signal and the calibration signal;

the optical fiber coupler is connected to the optical fiber grating sensors and the photoelectric detection circuit, and the optical fiber coupler is configured to shunt the laser signal, transmit the shunted laser signals to the optical fiber grating sensors of the different channels on the power transmission line, receive the first optical signals returned from the optical fiber grating sensors, combine the first optical signals, and transmit the combined first optical signals to the photoelectric detection circuit;

the photoelectric detection circuit is connected to the signal processing circuit, and the photoelectric detection circuit is configured to convert the combined first optical signals into an electrical signal, and transmit the electrical signal to the signal processing circuit; and the signal processing circuit is connected to the edge calculation and signal return circuit, and the signal processing circuit is configured to demodulate the electrical signal to obtain the demodulated first optical signals, and output the demodulated first optical signals to the edge calculation and signal return circuit.

3. The device of claim 2, wherein a type of the optical fiber coupler is determined through a total number of the optical fiber grating sensors.

4. The device of claim 1, wherein the other monitoring devices comprise a first device adopting wireless transmission and a second device adopting wired transmission, the sensing data of the other monitoring devices comprises first sensing data corresponding to the first device and second sensing data corresponding to the second device, and the convergence circuit comprises a wireless convergence circuit and a wired convergence circuit;

wherein the wireless convergence circuit is configured to receive the first sensing data, converge the first sensing data, and output the converged first sensing data to the electro-optical converter; and the wired convergence circuit is configured to receive the second sensing data, converge the second sensing data, and output the converged second sensing data to the electro-optical converter.

5. The device of claim 4, wherein the wireless convergence circuit receives the first sensing data by at least one of LoRa, Bluetooth, ZigBee or Wi-Fi.

6. The device of claim 4, wherein the wired convergence circuit receives the second sensing data via at least one of an RS485 bus or an optical fiber.

7. The device of claim 1, wherein the other monitoring devices comprise at least one of a camera, a micro-meteorological monitoring device, a tension sensor, a wireless vibration sensor or a wireless temperature measurement sensor.

8. The device of claim 1, wherein the edge calculation and signal return circuit comprises an edge calculation circuit and a signal return circuit;

the edge calculation circuit is connected to the optical fiber grating demodulation circuit, the electro-optical converter and the signal return circuit, and the edge calculation circuit is configured to perform fault or abnormality information extraction on the demodulated first optical signals and the second optical signal through an edge calculation algorithm to obtain extracted information, encode the extracted information to obtain the encoded communication optical signal, and transmit the encoded communication optical signal to the signal return circuit; and the signal return circuit is connected to the monitoring master station, and the signal return circuit is configured to receive the encoded communication optical signal and return the encoded communication optical signal to the monitoring master station.

9. The device of claim 1, further comprising a power management device;

wherein the power management device is connected to the optical fiber grating demodulation circuit and the convergence circuit, and the power management device is configured to perform power supply management on the optical fiber grating demodulation circuit and the convergence circuit in the monitoring device;

wherein a power supply form of the power management device comprises at least one of a storage battery, photovoltaic, wind energy or induction power extraction.

10. A photoelectric fusion long-distance monitoring method for a power transmission line for a power transmission line, comprising:

transmitting, by an optical fiber grating demodulation circuit, a laser signal to an optical fiber grating sensor on the power transmission line, receiving a first optical signal returned from the optical fiber grating sensor, demodulating the first optical signal, and outputting the demodulated first optical signal to an edge calculation and signal return circuit;

receiving, by a convergence circuit, sensing data of other monitoring devices on the power transmission line other than the optical fiber grating sensor, converging the sensing data, and outputting the converged sensing data to an electro-optical converter;

receiving, by the electro-optical converter, the converged sensing data, converting the converged sensing data into a second optical signal, and outputting the second optical signal to the edge calculation and signal return circuit; and calculating, encoding and processing, by the edge calculation and signal return circuit, the demodulated first optical signal and the second optical signal to obtain an encoded communication optical signal, and returning the encoded communication optical signal to a monitoring master station.

11. The method of claim 10, wherein transmitting, by the optical fiber grating demodulation circuit, the laser signal to the optical fiber grating sensor on the power transmission line, receiving the first optical signal returned from the optical fiber grating sensor, demodulating the first optical signal, and outputting the demodulated first optical signal to the edge calculation and signal return circuit comprises:

generating, by a control and driving circuit, a control signal to control and drive a tunable laser through the control signal;

generating, by an on-line calibration wavelength circuit, a calibration signal to calibrate a laser signal outputted by the tunable laser;

transmitting, by the tunable laser, the laser signal to an optical fiber coupler based on the control signal and the calibration signal;

shunting, by the optical fiber coupler, the laser signal, transmitting the shunted laser signals to optical fiber grating sensors of different channels on the power transmission line, receiving first optical signals returned from the optical fiber grating sensors, combining the first optical signals, and transmitting the combined first optical signals to a photoelectric detection circuit;

converting, by the photoelectric detection circuit, the combined first optical signals into an electrical signal, and transmitting the electrical signal to a signal processing circuit; and demodulating, by the signal processing circuit, the electrical signal to obtain the demodulated first optical signals, and outputting the demodulated first optical signals to the edge calculation and signal return circuit.

12. The method of claim 10, wherein the other monitoring devices comprise a first device adopting wireless transmission and a second device adopting wired transmission, the sensing data of the other monitoring devices comprises first sensing data corresponding to the first device and second sensing data corresponding to the second device, and receiving, by the convergence circuit, the sensing data of the other monitoring devices on the power transmission line other than the optical fiber grating sensor, converging the sensing data, and outputting the converged sensing data to the electro-optical converter comprises:

receiving, by a wireless convergence circuit, the first sensing data, converging the first sensing data, and outputting the converged first sensing data to the electro-optical converter; and receiving, by a wired convergence circuit, the second sensing data, converging the second sensing data, and outputting the converged second sensing data to the electro-optical converter.

13. The method of claim 10, wherein calculating, encoding and processing, by the edge calculation and signal return circuit, the demodulated first optical signal and the second optical signal to obtain the encoded communication optical signal, and returning the encoded communication optical signal to the monitoring master station comprises:

performing, by an edge calculation circuit, fault or abnormality information extraction on the demodulated first optical signal and the second optical signal through an edge calculation algorithm to obtain extracted information, encoding the extracted information to obtain the encoded communication optical signal, and transmitting the encoded communication optical signal to a signal return circuit; and receiving, by the signal return circuit, the encoded communication optical signal, and returning the encoded communication optical signal to the monitoring master station.

14. The method of claim 10, further comprising:

performing, by a power management device, power supply management on the optical fiber grating demodulation circuit and the convergence circuit in a monitoring device.

15. The method of claim 10, wherein after calculating, encoding and processing, by the edge calculation and signal return circuit, the demodulated first optical signal and the second optical signal to obtain the encoded communication optical signal, and returning the encoded communication optical signal to the monitoring master station, the method further comprises:

identifying, processing and displaying, by the monitoring master station, the encoded communication optical signal returned by a monitoring device.

* * * * *